United States Patent
Kimura

(10) Patent No.: US 11,162,499 B2
(45) Date of Patent: Nov. 2, 2021

(54) VACUUM PUMP SYSTEM

(71) Applicant: SHIMADZU CORPORATION, Kyoto (JP)

(72) Inventor: Hiroaki Kimura, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 84 days.

(21) Appl. No.: 16/830,396

(22) Filed: Mar. 26, 2020

(65) Prior Publication Data

US 2020/0332801 A1 Oct. 22, 2020

(30) Foreign Application Priority Data

Apr. 18, 2019 (JP) .............................. JP2019-079382

(51) Int. Cl.
| | | |
|---|---|---|
| F04D 19/04 | (2006.01) | |
| C23C 14/56 | (2006.01) | |
| F04D 29/42 | (2006.01) | |
| F04D 15/00 | (2006.01) | |
| C23C 14/00 | (2006.01) | |
| C23C 16/00 | (2006.01) | |

(52) U.S. Cl.
CPC ........ F04D 19/042 (2013.01); C23C 14/0042 (2013.01); C23C 14/56 (2013.01); C23C 16/00 (2013.01); F04D 15/00 (2013.01); F04D 19/044 (2013.01); F04D 29/4213 (2013.01)

(58) Field of Classification Search
CPC ..... C23C 14/56; C23C 14/0042; C23C 16/00; C23C 16/54; C23C 16/4412; F04D 19/042; F04D 15/00; F04D 19/044; F04D 29/4213; F04D 27/001; F04D 27/008
See application file for complete search history.

(56) References Cited

U.S. PATENT DOCUMENTS

| | | | | |
|---|---|---|---|---|
| 4,975,168 | A * | 12/1990 | Ohno | .................. C23C 14/0042 204/192.13 |
| 6,416,290 | B1 * | 7/2002 | Yamauchi | ............. F04D 19/042 417/32 |
| 7,751,921 | B2 * | 7/2010 | Sakamoto | ........... C23C 16/4412 700/108 |
| 2008/0050538 | A1 * | 2/2008 | Hirata | ............... C23C 16/45527 427/585 |
| 2013/0071258 | A1 | 3/2013 | Enomoto | |

FOREIGN PATENT DOCUMENTS

| | | |
|---|---|---|
| JP | 2011247823 A | 12/2011 |
| JP | 5767632 B | 8/2015 |

OTHER PUBLICATIONS

Office Action for corresponding CN Application No. 2020101418693 dated Aug. 13, 2021, with English language translation.

* cited by examiner

*Primary Examiner* — Woody A Lee, Jr.
*Assistant Examiner* — Brian Christopher Delrue
(74) *Attorney, Agent, or Firm* — Renner, Otto, Boisselle & Sklar, LLP

(57) ABSTRACT

A vacuum pump system comprises: a vacuum pump including a suction port, an exhaust port, and a pressure detection section configured to detect a gas pressure in a gas flow path through which gas sucked through the suction port flows to the exhaust port; and an arithmetic device configured to perform arithmetic processing for a state of a deposition substance in the gas flow path based on the gas pressure detected by the pressure detection section.

20 Claims, 7 Drawing Sheets

FIFTH EMBODIMENT

VACUUM PUMP SYSTEM

BACKGROUND OF THE INVENTION

1. Technical Field

The present invention relates to a vacuum pump system.

2. Background Art

At steps such as dry etching and CVD in manufacturing of a semiconductor and a liquid crystal panel, gas in a process chamber is, for performing processing in the high-vacuum process chamber, discharged by a vacuum pump such as a turbo-molecular pump such that high vacuum is maintained, for example. In the case of discharging the gas from the process chamber in, e.g., dry etching or CVD, a reactive product is deposited in the pump in association with discharging of the gas.

Regarding such deposition of the reactive product, Patent Literature 1 (JP 5767632) discloses the method for sensing a product deposited in a pump. In the deposition sensing method disclosed in Patent Literature 1, a current value of a motor configured to rotatably drive a rotary body of a pump is measured, and a warning is issued in a case where the amount of change in a measurement value with respect to an initial motor current value is equal to or greater than a predetermined value.

SUMMARY OF THE INVENTION

However, an exhaust gas flow rate actually greatly fluctuates in a single process, and for this reason, the current value of the motor configured to rotatably drive the rotary body also greatly fluctuates in association with fluctuation in the gas flow rate. Thus, erroneous determination is inevitable.

A vacuum pump system comprises: a vacuum pump including a suction port, an exhaust port, and a pressure detection section configured to detect a gas pressure in a gas flow path through which gas sucked through the suction port flows to the exhaust port; and an arithmetic device configured to perform arithmetic processing for a state of a deposition substance in the gas flow path based on the gas pressure detected by the pressure detection section.

According to the present invention, a deposition state of a deposition substance in an exhaust flow path can be accurately estimated.

DETAILED DESCRIPTION OF THE EXEMPLARY EMBODIMENTS

Hereinafter, modes for carrying out the present invention will be described with reference to the drawings.

First Embodiment

Figure 1:
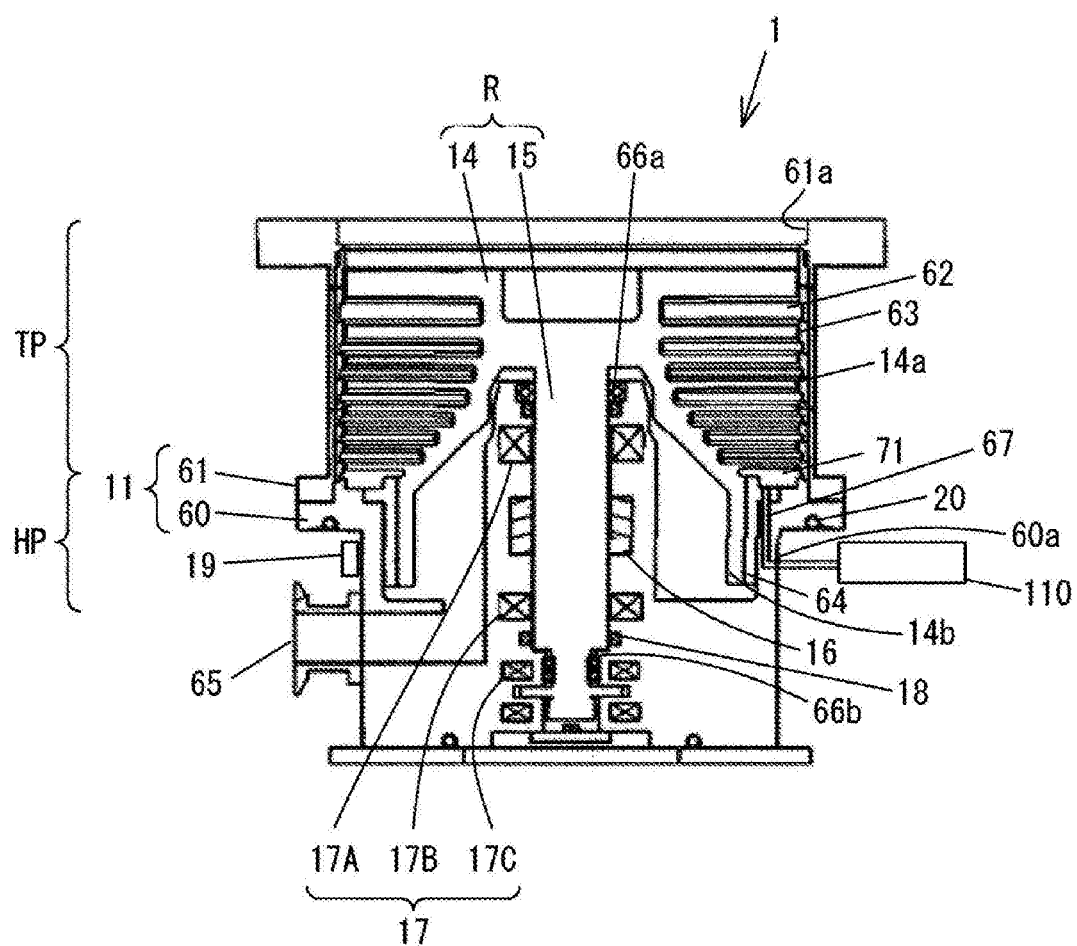
FIG. 1 is a view of a configuration of a turbo-molecular pump according to a first embodiment.
Figure 2:
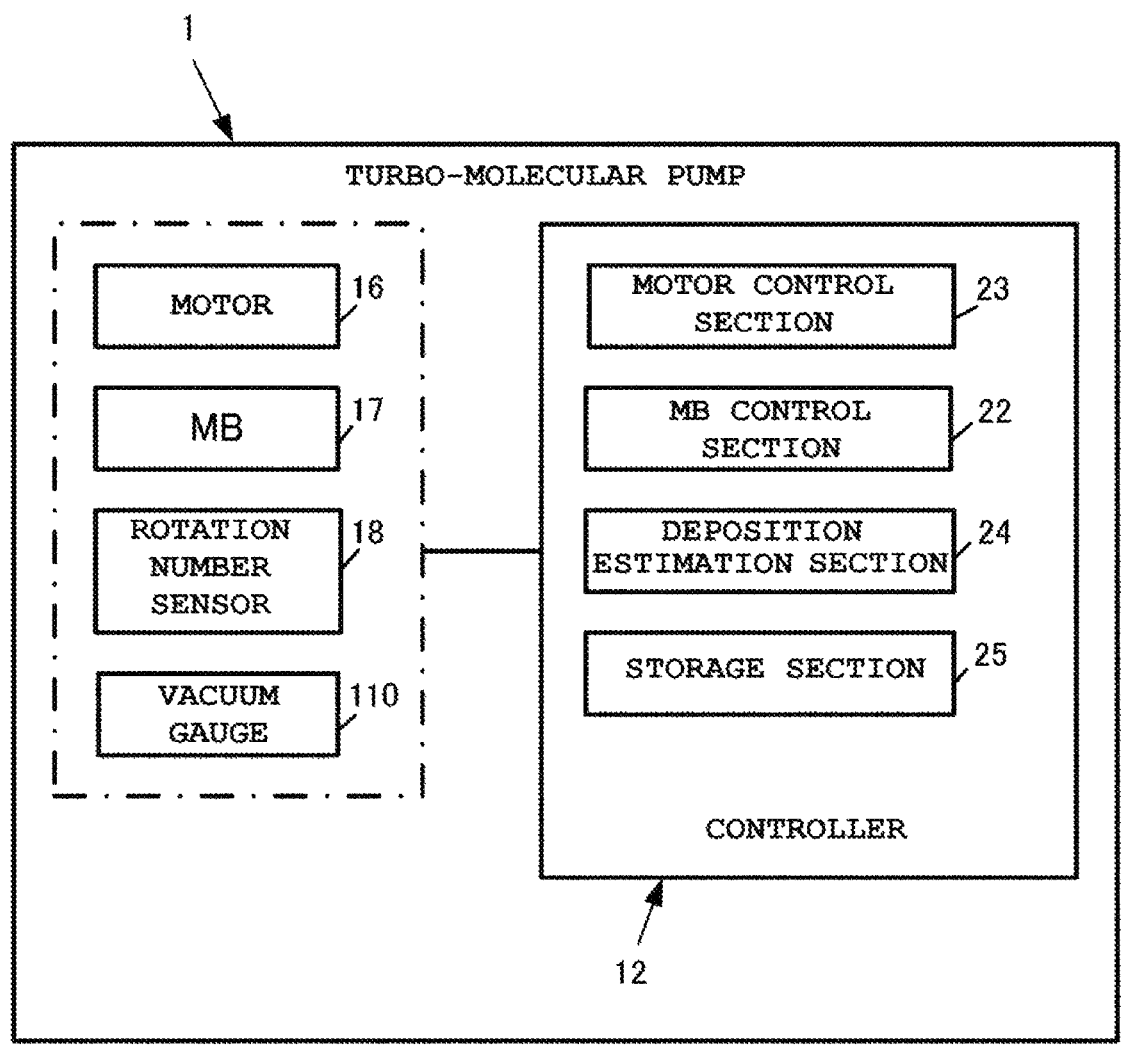
FIG. 2 is a diagram of a configuration of a deposition estimation device used in the turbo-molecular pump according to the first embodiment.

FIG. 1 is a view of a vacuum pump 1 in a first embodiment, and FIG. 2 is a diagram of a controller 12 configured to drivably control the vacuum pump 1. The vacuum pump 1 is attached to a not-shown process chamber through a not-shown pressure regulating valve. The vacuum pump 1, the pressure regulating valve and the like are drivably controlled by the controller 12 (see FIG. 2), thereby performing pressure regulating control of an air pressure in the process chamber. That is, the controller 12 performs control of the pressure regulating valve, control of a pump motor, temperature control, and magnetic levitation control. The controller 12 also performs arithmetic deposition estimation processing. In the arithmetic deposition estimation processing, a deposition state of a deposition substance in a flow path is estimated based on a gas pressure of a gas flow path of the vacuum pump 1.

The controller 12 will be described later with reference to FIG. 2.

The vacuum pump 1 illustrated in FIG. 1 is a magnetic bearing turbo-molecular pump including, as exhaust functional sections, a turbo pump portion TP having turbine blades and a Holweck pump portion HP having a spiral groove. The turbo pump portion TP and the Holweck pump portion HP are provided in a pump housing 11 called a housing. The pump housing 11 has a base 60 and a case 61 stacked on the base 60. An exhaust port 65 is provided at a side surface of the base 60, and a suction port 61a is provided at an upper surface of the case 61. The process chamber as a vacuum chamber is connected to the suction port 61a through the not-shown pressure regulating valve, and a not-shown auxiliary pump called a back pump is connected to the exhaust port 65. A pressure regulating valve is provided instead of the auxiliary pump in some cases. The inside of the process chamber is vacuum-pumped by the turbo-molecular pump 1, and is regulated to a predetermined pressure by the pressure regulating valve.

The present invention is not limited to the vacuum pump including the turbo pump portion TP and the Holweck pump portion HP as the exhaust functional sections. The present invention can be also applied to a vacuum pump including only turbine blades, a vacuum pump including only a drag pump such as a Siegbahn pump or a Holweck pump, and a combination thereof.

Note that the Holweck pump portion HP is also called a screw groove pump portion.

A rotary body R is provided at the pump housing 11. The rotary body R includes a pump rotor 14 and a rotor shaft 15 fastened to the pump rotor 14. The rotor shaft 15 is rotatably driven by a pump motor 16.

At the pump rotor 14, multiple stages of rotor blades 14a are formed on an upstream side, and a cylindrical portion 14b forming the screw groove pump portion is formed on a downstream side. On a stationary side, multiple stationary blade stators 62 and a cylindrical screw stator 64 are provided corresponding to these components. There are a form in which a screw groove is formed at an inner peripheral surface of the screw stator 64 and a form in which a screw groove is formed at an outer peripheral surface of the cylindrical portion 14b, for example. Each stationary blade stator 62 is mounted on the base 60 through a spacer ring 63.

Of the pump housing 11, an upstream side is the turbo pump portion TP, and a downstream side is the Holweck pump portion HP.

The rotor shaft 15 is magnetically levitated and supported by radial magnetic bearings 17A, 17B and an axial magnetic bearing 17C provided at the base 60, and is rotatably driven by the motor 16. The magnetic bearings 17A to 17C each include electromagnets and displacement sensors, and a levitation position of the rotor shaft 15 is detected by the displacement sensors. The number of rotations of the rotor shaft 15 is detected by a rotation number sensor 18. In a case where the magnetic bearings 17A to 17C are not in operation, the rotor shaft 15 is supported by emergency mechanical bearings 66a, 66b. The magnetic bearings 17A to 17C are indicated by a representative reference numeral of 17.

When the rotor shaft 15 to which the pump rotor 14 is fastened is rotated at high speed by the motor 16, gas molecules on a suction port 61a side are discharged to an exhaust port 65 side.

A heater 19 and a refrigerant pipe 20 in which refrigerant such as coolant water flows are provided at the base 60. A not-shown refrigerant supply pipe is connected to the refrigerant pipe 20, and by opening/closing control of an electromagnetic on-off valve placed at the refrigerant supply pipe, the flow rate of refrigerant to the refrigerant pipe 20 can be adjusted. In the case of discharging gas easily leading to deposition of a reactive product, temperature adjustment is, for reducing product deposition on the screw groove pump portion and the downstream-side rotor blades 14a, performed by ON/OFF of the heater 19 and ON/OFF of the flow rate of refrigerant in the refrigerant pipe 20 such that, e.g., a base temperature in the vicinity of a screw stator fixing portion reaches a predetermined temperature.

(Controller 12)

The controller 12 will be described with reference to FIG. 2.

As illustrated in FIG. 1, the turbo-molecular pump 1 includes the motor 16, the magnetic bearings (MB) 17, and the rotation number sensor 18. The controller 12 includes an arithmetic processing device such as a CPU or a FPGA. The arithmetic processing device functions as a motor control section 23, a magnetic bearing control section (a MB control section) 22, and a deposition estimation section 24. A storage section 25 stores, for example, a program for drivably controlling the pump and a program (hereinafter referred to as a deposition estimation program) for estimating the deposition state of the deposition substance. As described later, in the storage section 25, a table showing the deposition state of the deposition substance in association with the gas pressure is prepared and stored in advance.

The motor control section 23 estimates the number of rotations of the rotor shaft 15 based on a rotation signal detected by the rotation number sensor 18, thereby controlling the motor 16 to a predetermined target rotation number based on the estimated number of rotations. As a gas flow rate increases, a load on the pump rotor 14 increases. Thus, the number of rotations of the motor 16 decreases. The motor control section 23 controls a motor current such that a difference between the rotation number detected by the rotation number sensor 18 and the predetermined target rotation number reaches zero, thereby maintaining the predetermined target rotation number (a rated rotation number).

The magnetic bearing 17 includes the bearing electromagnet and the displacement sensor configured to detect the levitation position of the rotor shaft 15.

As described later, a vacuum gauge 110 is a pressure gauge configured to detect the gas pressure of a gas flow path 71 of a boundary region between the turbo pump portion TP and the Holweck pump portion HP.

The deposition estimation section 24 is an arithmetic device configured to execute the deposition estimation program stored in the storage section 25 to estimate the deposition state of the deposition substance in the gas flow path of the turbo-molecular pump 1 based on the gas pressure P110 detected by the vacuum gauge 110. A state in which the turbo-molecular pump 1 cannot be normally operated due to excessive deposition of the deposition substance is defined as a pump failure state. For preventing the pump failure state in advance, occurrence of pump failure is predicted at a moment sufficiently before the moment of occurrence of the pump failure state. Note that a moment at which pump failure is predicted will be herein referred to as pump failure detection.

Note that the turbo-molecular pump 1 is generally continuously rotated with the constant number of rotations, and the opening degree of the pressure regulating valve is generally controlled according to a target pressure of the process chamber. There are various forms of control of the opening degree of the pressure regulating valve, such as a form in which the control is performed by the controller 12 or a separately-provided main controller.

(Detection of Deposition State)

As described above, in the turbo-molecular pump 1 of the first embodiment, the vacuum gauge 110 configured to detect the gas pressure in the boundary region between the turbo pump portion TP and the Holweck pump portion HP, i.e., the flow path 71 communicating from the turbo pump portion TP to the Holweck pump portion HP. That is, a gas pressure measurement port 60a, where the vacuum gauge 110 can be connected, is provided at an outer peripheral surface of the base 60, and a gas pressure measurement path (hereinafter referred to as a measurement path) 67 is provided between the gas pressure measurement port 60a and the flow path 71 of the above-described boundary region. The vacuum gauge 110 may be provided in the pump housing 11. For example, the vacuum gauge 110 may be provided on the upper surface of the screw stator 64 or on the base 60.

Based on the gas pressure P110 of the vacuum gauge 110, a deposition substance amount is estimated or predicted by the deposition estimation program mounted on the storage section 25 of the controller 12. In the first embodiment, the deposition substance amount can be estimated as follows, for example.

The table (hereinafter referred to as a gas pressure-deposition state table) showing the deposition state of the deposition substance in association with the gas pressure is prepared and stored in advance in the storage section 25 of the controller 12. From the detected gas pressure P110, the deposition state of the deposition substance is read with reference to the gas pressure-deposition state table. In a case where the gas pressure indicating the deposition state is equal to or higher than a predetermined threshold, abnormal operation of the turbo-molecular pump 1, i.e., failure of the turbo-molecular pump 1, is warned. The threshold in this case is a failure determination threshold.

Note that even in a case where the gas pressure P110 is a value smaller than the failure determination threshold, the gas pressure P110 might reach equal to or higher than the failure determination threshold in the near future such as one hour after. Such a gas pressure can be set as the failure determination threshold. That is, multiple failure determination thresholds can be set and can be informed and warned to a user.

As described above, in the vacuum pump of the first embodiment, the following features and advantageous effects are provided.

Fluctuation in the gas pressure in association with an increase in the deposition substance is greater as compared to fluctuation in the motor current, and therefore, a change in the state of the deposition substance can be detected promptly. For determining an increase in the deposition substance due to fluctuation in the motor current, accurate detection cannot be made as long as the pressure does not increase to about 150 Pa, for example. On this point, in the embodiment in which the deposition state of the deposition substance is detected by pressure fluctuation in the boundary region 71 between the turbo pump portion TP and the Holweck pump portion HP, accurate detection can be made by the vacuum gauge 110 within a range of about 20 Pa to 50 Pa, for example. Note that in a case where the pressure fluctuates within a range of about 20 Pa to 50 Pa, the motor current fluctuates within a range of 0.1 A to 0.5 A. However, it is difficult to make high-accuracy detection, considering, e.g., noise superimposed on the motor current.

Second Embodiment

A turbo-molecular pump 1 of a second embodiment is a vacuum pump configured so that monitoring of a deposition state of a deposition substance by detection of an inlet-side gas pressure of a turbo pump portion TP can be performed in addition to detection of the pressure of gas flowing in a flow path 71 of a boundary region between the turbo pump portion TP and a Holweck pump portion HP.

Figure 3:
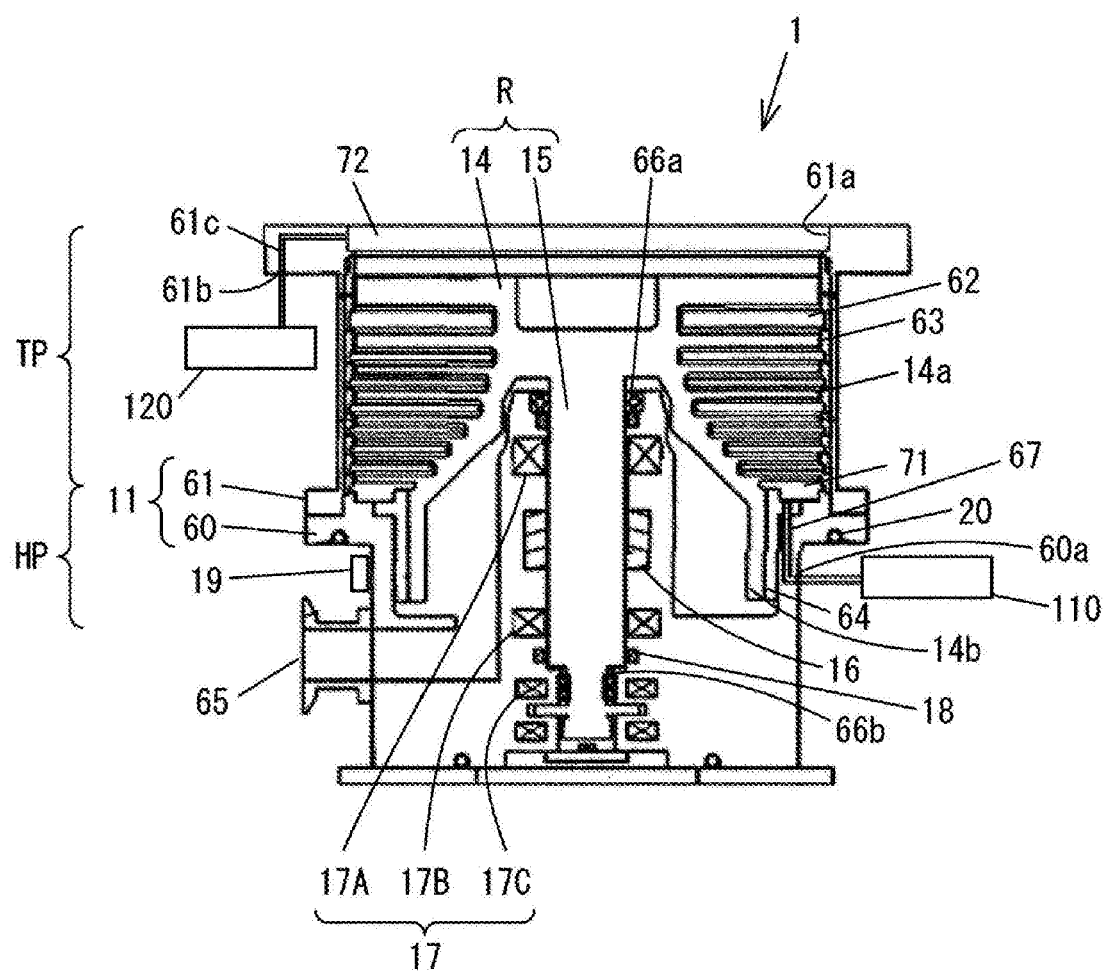
FIG. 3 is a view of a configuration of a turbo-molecular pump according to a second embodiment.

Differences from the first embodiment will be mainly described below with reference to FIG. 3.

In the turbo-molecular pump 1 of the second embodiment, a vacuum gauge 120 configured to measure the inlet-side gas pressure of the turbo pump portion TP is provided. A suction port 61a, where the vacuum gauge 120 can be connected, has a flow path 72 in which exhaust gas from a process chamber flows through a not-shown pressure regulating valve, and the vacuum gauge 120 detects a gas pressure of the flow path 72. That is, a gas pressure measurement port 61b is provided at an outer surface of a case 61, and a gas pressure measurement path (hereinafter referred to as a measurement path) 61c is provided between the gas pressure measurement port 61b and the inlet-side gas flow path 72. The vacuum gauge 120 may be provided in the pump housing 11. For example, the vacuum gauge 120 may be provided on the suction port 61a. FIG. 3 is for schematically describing an attachment position of the vacuum gauge 120, and a placement position of the gas pressure measurement port 61b is properly set according to the specifications of the turbo-molecular pump 1.

Based on a detection pressure P110 of a vacuum gauge 110 and a detection pressure P120 of the vacuum gauge 120, a deposition substance amount is estimated or predicted by a deposition estimation program mounted on a storage section 25 of a controller 12. In the second embodiment, the deposition substance amount can be estimated as follows, for example.

In the vacuum pump of the second embodiment, the gas pressure P120 of the suction port 61a and the gas pressure P110 of the flow path 71 of the boundary region between the turbo pump portion TP and the Holweck pump portion HP are each detected by the vacuum gauges 110, 120. A difference ΔP1 between the gas pressures P110, P120 indicates a pressure loss in a gas flow path between the gas inlet port 72 and the gas outlet port 71 of the turbo pump portion TP. Thus, the difference ΔP1 right after the start of use of the turbo-molecular pump 1 is measured and stored as a reference value, and based on deviation from the difference ΔP1, the deposition state of the deposition substance can be detected. Note that a fraction between the gas pressures P110, P120 may be used instead of the difference ΔP1.

In the storage section 25 of the controller 12, a table showing the deposition state of the deposition substance in association with the difference ΔP1 is prepared and stored in advance. From the difference ΔP1 between the detected gas pressures P110, P120, the deposition state of the deposition substance is read with reference to the table. In a case where the difference ΔP1 is equal to or greater than a predetermined threshold, abnormal operation of the turbo-molecular pump 1, i.e., failure of the turbo-molecular pump 1, is warned. The threshold in this case is a failure determination threshold.

Note that even in a case where the difference ΔP1 in the gas pressure is a value smaller than the failure determination threshold, the difference ΔP1 might reach equal to or greater than the failure determination threshold in the near future such as one hour after. Such a gas pressure can be set as the failure determination threshold. That is, multiple failure determination thresholds can be set and can be informed and warned to a user.

As described above, in the vacuum pump of the second embodiment, the following features and advantageous effects are provided.

In the first embodiment in which the deposition state of the deposition substance is detected only based on fluctuation in the outlet pressure of the turbo pump portion TP, the deposition state cannot be accurately detected in a case where multiple target pressures in the process chamber are set. On this point, in the second embodiment, the difference ΔP1 between the pressure P110 and the pressure P120 is used, and therefore, a pressure loss in the turbo pump portion TP can be accurately detected even in a case where the pressure of the suction port 61a of the turbo-molecular pump 1 varies. As a result, even when the pressure target value varies according to processing contents in the process chamber, i.e., regardless of the recipe of the processing performed in the process chamber, high-accuracy deposition detection is allowed.

Third Embodiment

A turbo-molecular pump 1 of a third embodiment is a vacuum pump configured so that monitoring of a deposition state of a deposition substance by detection of an outlet-side gas pressure of a Holweck pump portion HP can be performed in addition to detection of the pressure of gas flowing in a flow path 71 of a boundary region between a turbo pump portion TP and the Holweck pump portion HP.

Figure 4:
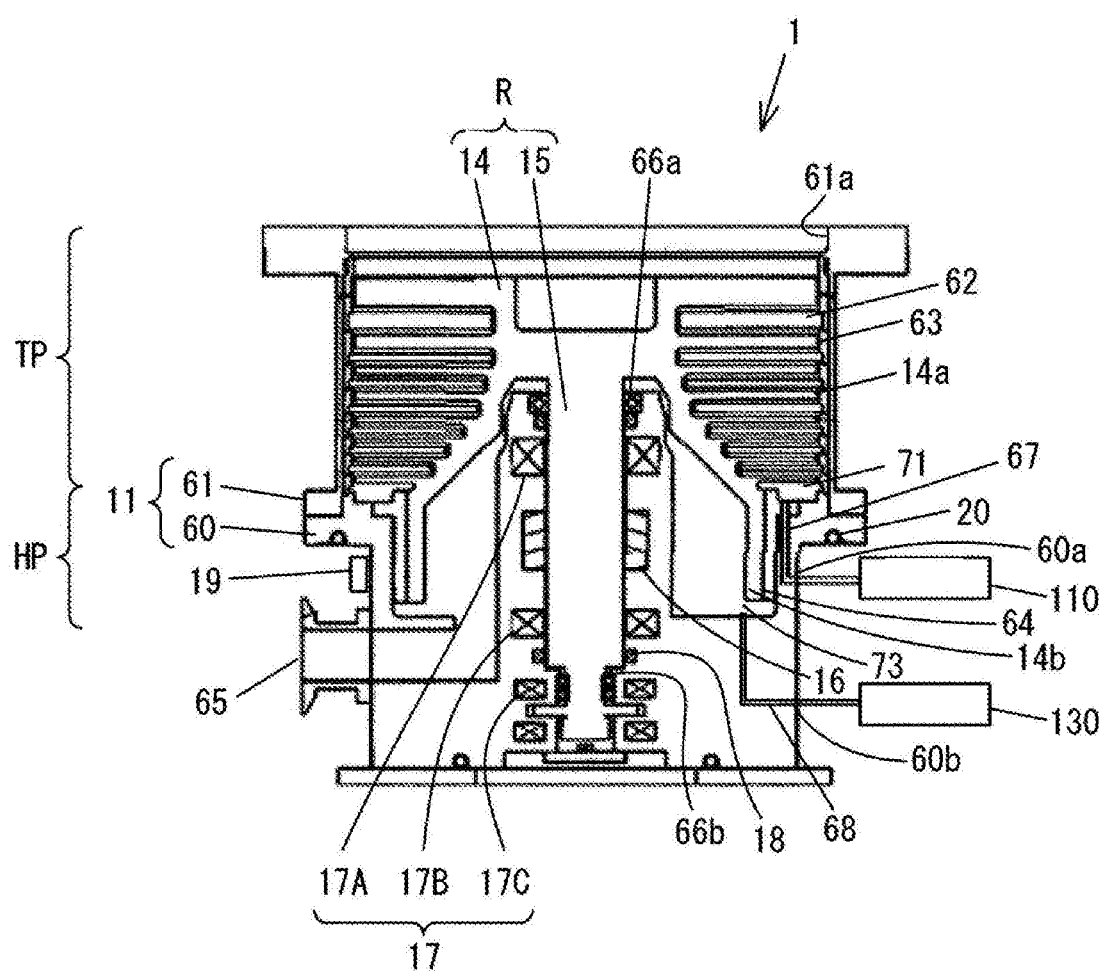
FIG. 4 is a view of a configuration of a turbo-molecular pump according to a third embodiment.

Differences from the first embodiment will be mainly described below with reference to FIG. 4.

In the turbo-molecular pump 1 of the third embodiment, a vacuum gauge 130 configured to measure the outlet-side gas pressure of the Holweck pump portion HP is provided. A gas pressure measurement port 60b, where the vacuum gauge 130 can be connected, is provided at an outer surface of the base 60, and a gas pressure measurement path (hereinafter referred to as a measurement path) 68 is provided between the gas pressure measurement port 60b and an outlet-side gas flow path 73 of the Holweck pump portion HP. FIG. 4 is for schematically describing an attachment position of the vacuum gauge 130, and a placement position of the gas pressure measurement port 60b is properly set according to the specifications of the turbo-molecular pump 1. The vacuum gauge 130 may be provided in the pump housing 11. For example, the vacuum gauge 130 may be provided on the surface of the base 60, which faces to the screw stator 64.

Based on a detection pressure P110 of a vacuum gauge 110 and a detection pressure P130 of the vacuum gauge 130, a deposition substance amount is estimated or predicted by a deposition estimation program mounted on a storage section 25 of a controller 12. In the third embodiment, the deposition substance amount can be estimated as follows, for example.

In the vacuum pump of the third embodiment, the gas pressure P110 of the flow path 71 of the boundary region between the turbo pump portion TP and the Holweck pump portion HP and the gas pressure P130 of the flow path 73 in the vicinity of an outlet side of the Holweck pump portion HP are each detected by the vacuum gauges 110, 130. A difference ΔP2 between the gas pressures P110, P130 indicates a pressure loss in a gas flow path between a gas inlet port and a gas outlet port of the Holweck pump portion HP. Thus, the difference ΔP2 right after the start of use of the turbo-molecular pump 1 is measured and stored as a reference value, and based on deviation from the difference ΔP2, the deposition state of the deposition substance can be detected. Note that a fraction between the gas pressures P110, P130 may be used instead of the difference ΔP2.

In the storage section 25 of the controller 12, a table showing the deposition state of the deposition substance in association with the difference ΔP2 is prepared and stored in advance. From the difference ΔP2 between the detected gas pressures P110, P130, the deposition state of the deposition substance is read with reference to the table. In a case where the difference ΔP2 is equal to or greater than a predetermined threshold, abnormal operation of the turbo-molecular pump 1, i.e., failure of the turbo-molecular pump 1, is warned. The threshold in this case is a failure determination threshold.

Note that even in a case where the difference ΔP2 in the gas pressure is a value smaller than the failure determination threshold, the difference ΔP2 might reach equal to or greater than the failure determination threshold in the near future such as one hour after. Such a gas pressure can be set as the failure determination threshold. That is, multiple failure determination thresholds can be set and can be informed and warned to a user.

As described above, in the vacuum pump of the third embodiment, the following features and advantageous effects are provided.

In the second embodiment in which the deposition state of the deposition substance is estimated based on the pressure difference ΔP1 between the outlet and inlet of the turbo pump portion TP, the deposition state of the deposition substance adhering to the Holweck pump portion HP cannot be estimated. On this point, in the third embodiment, the difference ΔP2 between the pressure P110 and the pressure P130 is used, and therefore, a pressure loss in the Holweck pump portion HP can be accurately detected. As a result, the deposition state of the deposition substance adhering to the Holweck pump portion HP can be estimated.

Fourth Embodiment

Figure 5:
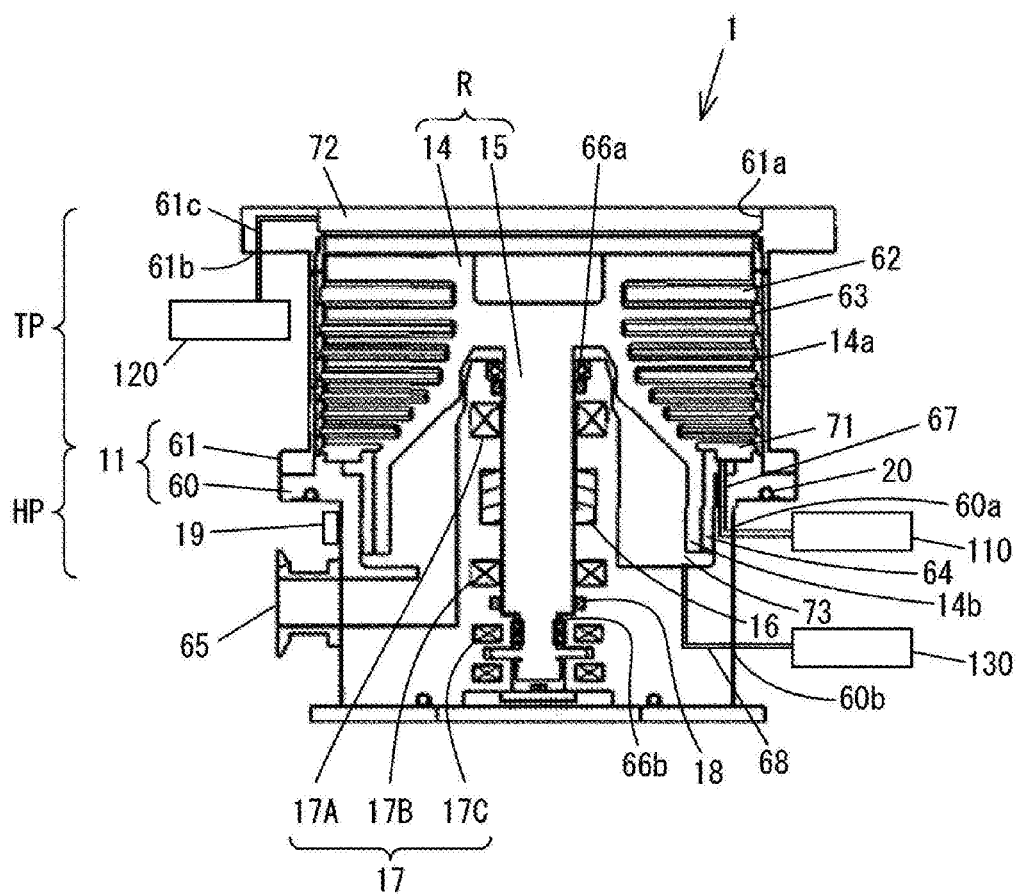
FIG. 5 is a view of a configuration of a turbo-molecular pump according to a fourth embodiment.

A fourth embodiment will be described with reference to FIG. 5.

A turbo-molecular pump 1 of the fourth embodiment includes a vacuum gauge 120 configured to detect a gas pressure (an inlet pressure of a turbo pump portion TP) P120 of a suction port 61a of the turbo-molecular pump 1, a vacuum gauge 110 configured to detect an outlet pressure (an inlet pressure of a Holweck pump portion HP) P110 of the turbo pump portion TP, and a vacuum gauge 130 configured to detect an outlet pressure P130 of the Holweck pump portion HP.

In the vacuum pump of the fourth embodiment, the following features and advantageous effects are provided.

Based on the gas pressures at three spots of an exhaust flow path, a deposition state of a deposition substance of the turbo pump portion TP and a deposition state of a deposition substance of the Holweck pump portion HP can be detected.

In the second embodiment in which the deposition state of the deposition substance is estimated based on the pressure difference ΔP1 between the outlet and inlet of the turbo pump portion TP, the deposition state of the deposition substance adhering to the Holweck pump portion HP cannot be estimated. Moreover, in the third embodiment in which the deposition state of the deposition substance is estimated based on the pressure difference ΔP2 between the outlet and inlet of the Holweck pump portion HP, the deposition state of the deposition substance adhering to the turbo pump portion TP cannot be estimated. On this point, in the fourth embodiment, the state of the deposition substance of the turbo pump portion TP can be estimated based on the pressure difference ΔP1 between the outlet and inlet of the turbo pump portion TP, and the deposition state of the deposition substance of the Holweck pump portion HP can be estimated based on the pressure difference ΔP2 between the outlet and inlet of the Holweck pump portion HP.

Fifth Embodiment

A fifth embodiment is an example where the present invention is applied to a vacuum pump device including a low-pressure-side pressure regulating valve provided on an inlet side of a turbo-molecular pump and a high-pressure-side pressure regulating valve provided on an outlet side. The vacuum pump device of the fifth embodiment measures a gas pressure of a gas exhaust side of the low-pressure-side pressure regulating valve and a gas pressure of a gas inlet side of the high-pressure-side pressure regulating valve, thereby monitoring a deposition state of a deposition substance. A difference from the first to fourth embodiments is that the deposition state of the deposition substance not in the single vacuum pump but in the vacuum pump device including the low-pressure-side pressure regulating valve and the high-pressure-side pressure regulating valve is monitored based on the gas pressure.

Differences from the second embodiment will be mainly described below.

Figure 6:
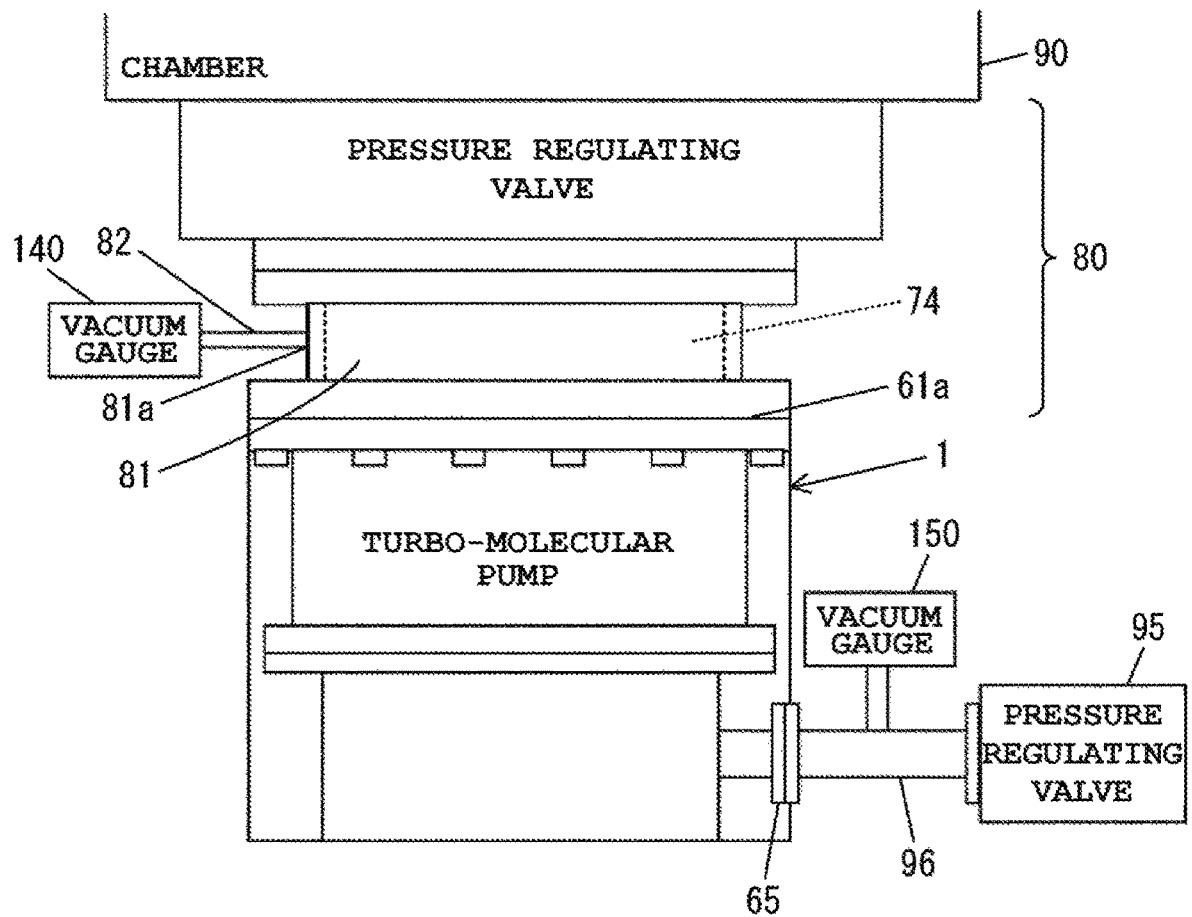
FIG. 6 is a view of a configuration of a turbo-molecular pump according to a fifth embodiment.

As illustrated in FIG. 6, the turbo-molecular pump 1 is, at a suction port 61a thereof, connected to a process chamber 90 through a low-pressure-side pressure regulating valve 80. A suction port of the low-pressure-side pressure regulating valve 80 is connected to the process chamber 90, and the low-pressure-side pressure regulating valve 80 regulates the pressure of gas flowing in the turbo-molecular pump 1. A high-pressure-side pressure regulating valve 95 is provided at an exhaust port 65 of the turbo-molecular pump 1 to regulate a gas exhaust pressure.

In the vacuum pump device of the fifth embodiment, a vacuum gauge 140 configured to detect the pressure of gas flowing out of a valve body of the low-pressure-side pressure regulating valve 80 is provided. That is, the vacuum gauge 140 detects a gas pressure in an upstream flow path 74 through which gas flowing out of the low-pressure-side pressure regulating valve 80 flows in the suction port 61a. Specifically, a gas pressure measurement port 81a is provided at an outer surface of an outlet-side housing 81 of the low-pressure-side pressure regulating valve 80, and the vacuum gauge 140 is provided at the gas pressure measurement port 81a through a pipe line 82.

Moreover, in the vacuum pump device of the fifth embodiment, a vacuum gauge 150 configured to detect a gas pressure of a gas inlet port of the high-pressure-side pressure regulating valve 95 is provided. That is, the vacuum gauge 150 detects a gas pressure of a pipe line 96 through which exhaust gas flowing out of the exhaust port 65 of the turbo-molecular pump 1 flows in the high-pressure-side pressure regulating valve 95.

Based on the detection pressure P140 of the vacuum gauge 140 and the detection pressure P150 of the vacuum gauge 150, a deposition substance amount is estimated or predicted by a deposition estimation program mounted on a storage section 25 of a controller 12. In the fifth embodiment, the deposition substance amount can be estimated as follows, for example.

As described above, in the vacuum pump of the fifth embodiment, the downstream-side pressure P140 of the valve body of the low-pressure-side pressure regulating valve 80 and the gas pressure P150 of the gas inlet port of the high-pressure-side pressure regulating valve 95 are each detected by the vacuum gauges 140, 150. A difference ΔP3 between the gas pressures P140, P150 indicates a pressure loss in a gas flow path from a gas inlet side of a turbo pump portion TP to a gas outlet side of the turbo-molecular pump 1. Thus, the difference ΔP3 right after the start of use of the turbo-molecular pump 1 is measured and stored as a reference value, and based on deviation from the difference ΔP3, the deposition state of the deposition substance can be detected.

As described above, in the vacuum pump of the fifth embodiment, the following features and advantageous effects are provided.

In the first embodiment in which the deposition state of the deposition substance is detected only based on fluctuation in the outlet pressure of the turbo pump portion TP, the deposition state cannot be accurately detected in a case where multiple target pressures in the process chamber are set (a case where a recipe is switched). On this point, in the fifth embodiment, the difference ΔP3 between P140 and P150 is used, and therefore, a pressure loss in the turbo pump portion TP can be accurately detected even in a case where the pressure of the suction port 61a of the turbo-molecular pump 1 correlating with the target pressure in the process chamber varies. Thus, even when the pressure of the suction port 61a of the turbo-molecular pump 1 is controlled by the low-pressure-side pressure regulating valve 80 according to processing contents (the recipe) in the process chamber, high-accuracy deposition estimation processing is allowed.

The following variations are also within the scope of the present invention, and can be combined with the above-described embodiments. In the following variations, the same reference numerals are used to represent, e.g., sections indicating structures and functions similar to those of the above-described embodiments, and description thereof will be omitted as necessary.

(First Variation)

In the second embodiment, the pressure difference ΔP1 between the suction pressure P120 and the outlet pressure P110 of the turbo pump portion TP is compared with the predetermined failure determination threshold to perform arithmetic processing for the deposition state of the deposition substance. Generally, the processing contents (the recipe) performed in the process chamber vary, and the failure determination threshold can be set for each recipe. Since the target pressure in the process chamber varies according to the recipe, evaluation of the deposition state based on the difference between the suction port pressure P120 and the outlet pressure P110 varies according to the recipe. Thus, in a first variation, the failure determination threshold for the deposition state for the difference ΔP1 is set for each recipe.

According to the first variation, even when the target pressure in the process chamber is changed due to switching of the recipe, the deposition state of the deposition substance can be accurately estimated.

(Second Variation)

In the second to fourth embodiments, the deposition state of the deposition substance is estimated based on the magnitude of the difference ΔP1 to ΔP3 in the gas pressure between two spots. In a second variation, the deposition state is estimated based on a temporal change in each of the gas pressures at two spots. For example, the following three examples are provided.

i) Based on a temporal change in each of the inlet-side pressure P120 and the outlet-side pressure P110 of the turbo pump portion TP, the deposition state of the deposition substance of the turbo pump portion TP may be estimated.

ii) Based on a temporal change in each of the inlet-side pressure P110 and the outlet-side pressure P130 of the Holweck pump portion HP, the deposition state of the deposition substance of the Holweck pump portion HP may be estimated.

iii) Based on a temporal change in each of the outlet-side pressure P140 of the low-pressure-side pressure regulating valve 80 and the inlet-side pressure P150 of the high-pressure-side pressure regulating valve 95, the deposition state of the deposition substance adhering to the flow path of the turbo-molecular pump 1 may be estimated.

According to the second variation, the deposition state can be accurately estimated using the temporal change in the gas pressures at two spots.

(Third Variation)

In the second to fifth embodiments, the deposition state is determined based on the magnitude of the difference ΔP1 to ΔP3 in the gas pressure between two spots. In a third variation, the deposition state is determined based on a temporal change in the difference ΔP1 to ΔP3 in the gas pressure between two spots. For example, the following three examples are provided.

i) Based on a temporal change in the difference ΔP1 between the inlet-side pressure P120 and the outlet-side pressure P110 of the turbo pump portion TP, the deposition state of the deposition substance of the turbo pump portion TP may be estimated.

ii) Based on a temporal change in the difference ΔP2 between the inlet-side pressure P110 and the outlet-side pressure P130 of the Holweck pump portion HP, the deposition state of the deposition substance of the Holweck pump portion HP may be estimated.

iii) Based on a temporal change in the difference ΔP3 between the outlet-side pressure P140 of the low-pressure-side pressure regulating valve and the inlet-side pressure P150 of the high-pressure-side pressure regulating valve, the deposition state of the deposition substance of the Holweck pump portion HP may be estimated.

According to the third variation, the deposition state can be more accurately estimated using the temporal change in the difference in the gas pressure between two spots. Since the difference in the pressure between two spots indicates the pressure loss, accurate estimation is allowed using a temporal change in the pressure loss.

(Fourth Variation)

In the vacuum pumps and the vacuum pump device of the first to fifth embodiments and the first to third variations, it is estimated whether or not operation failure has been occurred. In a fourth variation, future occurrence of operation failure is predicted.

Prediction is, as one example, made by comparison between a previously-obtained gas pressure temporal change and a currently-obtained gas pressure temporal change. For example, in the case of a tendency similar to that of characteristics of a previous gas pressure temporal change leading to the failure determination threshold, future operation failure can be predicted.

Using characteristics of a temporal change in a difference in a gas pressure between multiple spots such as a gas flow path upstream side and a gas flow path downstream side, prediction can be, as another example, made by comparison among previously-obtained difference temporal characteristics and currently-obtained difference temporal characteristics.

According to the fourth variation, operation failure due to an increase in the amount of the adhering deposition substance can be predicted, and maintenance can be properly performed before interruption of operation.

In each of the above-described embodiments and the first to fourth variations, the deposition estimation section 24 is provided in the controller 12 of the turbo-molecular pump, and the deposition estimation section 24 estimates the deposition state based on the deposition estimation program and the gas pressure-deposition state table stored in the storage section 25. That is, the vacuum pump 1 can be considered as a vacuum pump system including a pump main body having the turbo pump portion TP and the Holweck pump portion HP, the vacuum gauge 110, the deposition estimation section 24, and the storage section 25 on which the deposition estimation program and the gas pressure-deposition state table are mounted.

The deposition state is not necessarily estimated in the controller as a control section of the vacuum pump as in each of the above-described embodiments and the first to fourth variations, but the arithmetic deposition estimation processing may be performed by an arithmetic processing device different from the vacuum pump.

(Fifth Variation)

Figure 7:
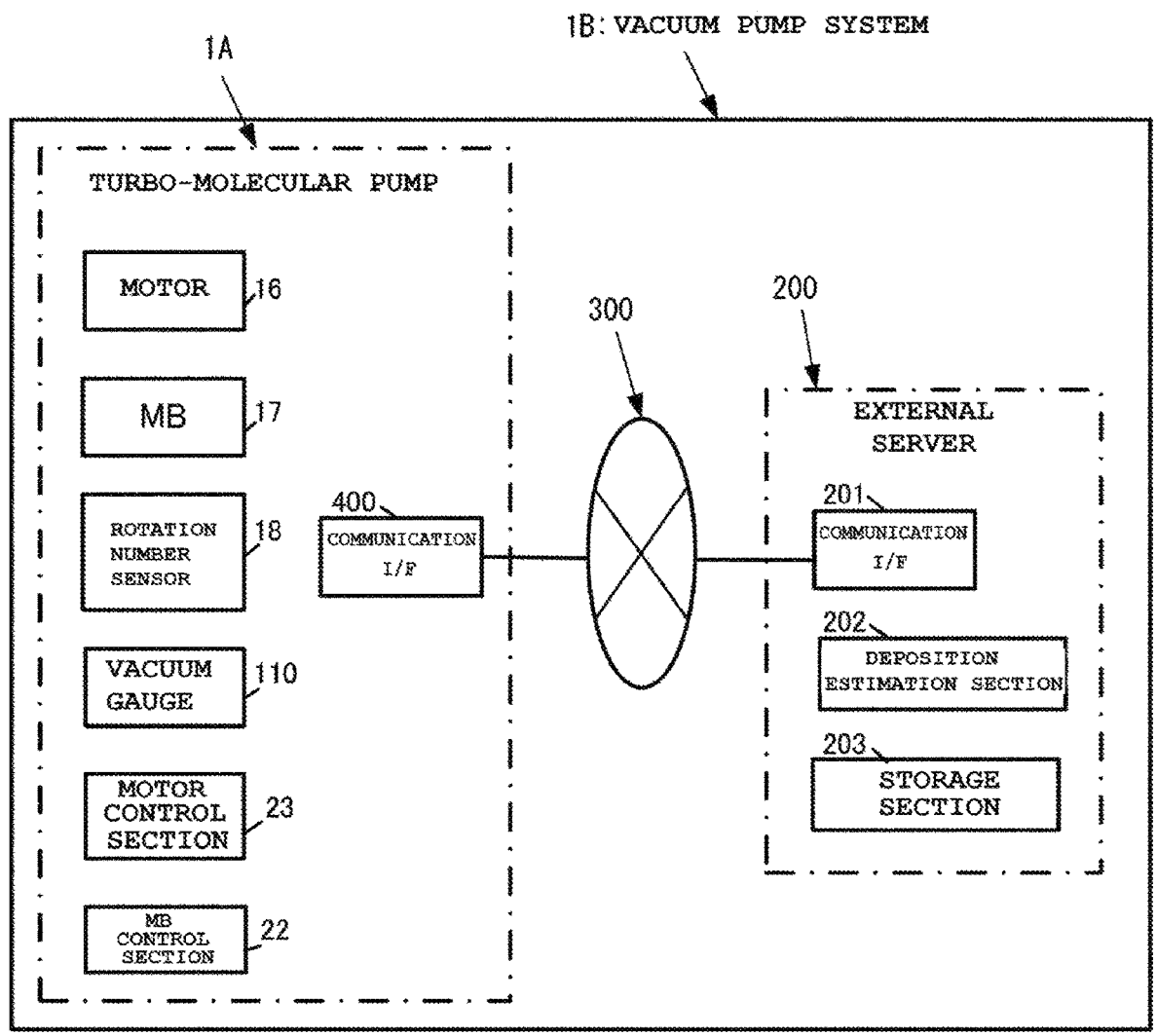
FIG. 7 is a diagram of a configuration of a vacuum pump system according to a fifth variation.

In each of the above-described embodiments and the first to fourth variations, the deposition estimation section 24 is provided in the controller 12 of the turbo-molecular pump, and the deposition estimation section 24 estimates the deposition state based on the deposition estimation program and the gas pressure-deposition state table stored in the storage section 25. However, description will be made with reference to FIG. 7. FIG. 7 is a diagram for describing a vacuum pump system 1B of a fifth variation. In the fifth variation, the deposition substance is estimated by an external server instead of estimation of the deposition substance on a vacuum pump side.

The vacuum pump system 1B includes a turbo-molecular pump 1A and an external server 200 connected to the turbo-molecular pump 1A via a network 300. The network 300 is a local network line or a public network such as the Internet. Although not shown in the figure, the turbo-molecular pump 1A includes, as illustrated in FIG. 1, the suction port 61a, the exhaust port 65, the pump main body having the turbo pump portion TP and the Holweck pump portion HP, and the vacuum gauge 110 provided at the gas flow path for discharging gas sucked through the suction port 61a from the exhaust port 65, and also includes the MB control section 22, the motor control section 23, and a communication interface (a communication I/F) 400. A pressure value measured by the vacuum gauge 110 is transmitted to the external server 200 by way of the network 300.

Note that the deposition estimation section 24 of the first to fifth embodiments and the storage section 25 for the deposition estimation program and the gas pressure-deposition state table are not provided at the turbo-molecular pump 1A.

The external server 200 includes a communication I/F 201 connected to the network 300, a deposition estimation section 202 configured to perform arithmetic processing for the deposition state of the deposition substance based on the received pressure value, and a storage section 203 storing the deposition estimation program and the gas pressure-deposition state table. The pump control program is stored in a not-shown storage section of the turbo-molecular pump 1A. The external server 200 is an arithmetic processing device including a processing device such as a CPU or a FPGA.

The deposition estimation section 202 of the external server 200 estimates, using the pressure value transmitted from the turbo-molecular pump 1A, the deposition state with reference to the gas pressure-deposition state table stored in the storage section 203. In the vacuum pump system of the fifth variation, features and advantageous effects similar to those described above are also provided.

The vacuum pump system 1B of the fifth variation can be also applied to the second to fifth embodiments and the first to fourth variations.

In the vacuum pumps of the embodiments and the variations described above, the following features and advantageous effects are provided.

(1) A vacuum pump system comprises: a vacuum pump including a suction port, an exhaust port, and a pressure detection section configured to detect a gas pressure in a gas flow path through which gas sucked through the suction port flows to the exhaust port; and an arithmetic device configured to perform arithmetic processing for a state of a deposition substance in the gas flow path based on the gas pressure detected by the pressure detection section. As compared to a case where the deposition state of the deposition substance is estimated based on the motor current, the deposition state of the deposition substance can be estimated with higher accuracy.

(2) The pressure detection section includes multiple pressure detection elements provided at different spots to detect gas pressures at multiple spots of the gas flow path and the arithmetic device performs, based on the gas pressures detected by the multiple pressure detection elements, the arithmetic processing for the state of the deposition substance in the gas flow path. As compared to a case where the deposition state is estimated based on the pressure at the single spot, the deposition state can be accurately estimated. Moreover, a spot at which the deposition state is degraded can be specified.

(3) The arithmetic device performs, based on a temporal change in each of the gas pressures detected by the multiple pressure detection elements, the arithmetic processing for the state of the deposition substance in the gas flow path. As compared to a case where the deposition state is estimated based on the pressure at the single spot, the deposition state can be accurately estimated. Moreover, a spot at which the deposition state is degraded can be specified.

(4) The arithmetic device performs, based on a difference or a fraction between the gas pressures detected by the multiple pressure detection elements, the arithmetic processing for the state of the deposition substance in the gas flow path. For example, the pressure difference between two spots of the upstream and downstream sides correlates with the pressure loss, and therefore, the deposition state can be accurately estimated.

(5) The arithmetic device performs, based on a temporal change in a difference or a fraction between the gas pressures detected by the multiple pressure detection elements, the arithmetic processing for the state of the deposition substance in the gas flow path. For example, the pressure difference between two spots of the upstream and downstream sides correlates with the pressure loss, and therefore, the deposition state can be accurately estimated. Moreover, use of the difference temporal change can prevent erroneous estimation.

(6) The arithmetic device includes a storage device configured to store a relationship between pressure information regarding the detected gas pressure and the deposition state of the deposition substance, and the arithmetic device performs the arithmetic processing for the deposition state based on the relationship between the pressure information and the deposition state of the deposition substance in the storage device and the gas pressure detected by the pressure detection section. The arithmetic deposition estimation processing is simplified, and processing time is shortened.

(7) For each recipe as a processing content performed in a process chamber connected to the vacuum pump, the storage device stores the relationship between the pressure information regarding the detected gas pressure and the deposition state of the deposition substance, and the arithmetic device performs the arithmetic processing for the deposition state based on the recipe and the pressure information regarding the gas pressure. Even when the target pressure in the process chamber is changed due to switching of the recipe, the deposition state of the deposition substance can be accurately estimated.

(8) The vacuum pump includes a turbo pump portion and/or a screw groove pump portion, the pressure detection section detects a gas pressure of the turbo pump portion and/or a gas pressure of the screw groove pump portion, and the arithmetic device performs the arithmetic processing for the state of the deposition substance based on the gas pressure detected in the gas flow path of the turbo pump portion and/or the screw groove pump portion. The deposition state of the deposition substance of various vacuum pumps such as the turbo-molecular pump and the drag pump can be estimated.

(9) The vacuum pump includes at least the turbo pump portion, the pressure detection section includes a first pressure detection section configured to detect a gas pressure of an upstream-side flow path of the turbo pump portion and a second pressure detection section configured to detect a gas pressure of a downstream-side flow path of the turbo pump portion, and the arithmetic device performs the arithmetic processing for the state of the deposition substance based on the gas pressures detected by the first pressure detection section and the second pressure detection section. The deposition state of the deposition substance in the turbo pump portion can be estimated.

(10) The vacuum pump includes at least the screw groove pump portion, the pressure detection section includes a first pressure detection section configured to detect a gas pressure of an upstream-side flow path of the screw groove pump portion and a second pressure detection section configured to detect a gas pressure of a downstream-side flow path of the screw groove pump portion, and the arithmetic device performs the arithmetic processing for the state of the deposition substance based on the gas pressures detected by the first pressure detection section and the second pressure detection section. The deposition state of the deposition substance in the screw groove pump portion can be estimated.

(11) The vacuum pump includes, in this order from an upstream side, the turbo pump portion and the screw groove pump portion, the pressure detection section includes a first pressure detection section configured to detect a gas pressure of an upstream-side flow path of the turbo pump portion and a second pressure detection section configured to detect a gas pressure of a downstream-side flow path of the screw groove pump portion, and the arithmetic device performs the arithmetic processing for the state of the deposition substance based on the gas pressures detected by the first pressure detection section and the second pressure detection section. The deposition state of the deposition substance in the exhaust flow path of the turbo-molecular pump can be estimated.

(12) The vacuum pump includes, in this order from an upstream side, the turbo pump portion and the screw groove pump portion, the pressure detection section includes a first pressure detection section configured to detect a gas pressure of an upstream-side flow path of the turbo pump portion, a second pressure detection section configured to detect a gas pressure in a flow path of downstream-side of the turbo pump portion and upstream-side of the screw groove pump portion, and a third pressure detection section configured to detect a gas pressure of a downstream-side flow path of the screw groove pump portion, and the arithmetic device performs the arithmetic processing for the state of the deposition substance based on the gas pressures detected by the first to third pressure detection sections. The deposition state of the deposition substance in the turbo pump portion and the screw groove pump portion can be estimated.

(13) The vacuum pump comprises a port where the pressure detection section can be connected from the outside of the vacuum pump.

(14) The pressure detection section is provided in a pump housing.

(15) The pressure detection section is provided on the upper surface of the stator of a screw groove pump portion or on a surface of a base.

(16) The pressure detection section is provided on a surface of a base, which faces to a stator of a screw groove pump portion.

(17) the pressure detection section is provided on a suction port.

(18) The arithmetic device estimates the state of the deposition substance of the turbo pump portion based on the pressure difference or the pressure fraction between the gas pressures detected by the first and the second pressure detection sections.

(19) The arithmetic device estimates the deposition state of the deposition substance of the screw groove pump portion based on the pressure difference or the pressure fraction between the gas pressures detected by the first and the second pressure detection sections.

(20) The arithmetic device estimates the state of the deposition substance of the turbo pump portion based on the pressure difference or the pressure fraction between the gas pressures detected by the first and the second pressure detection sections, and estimates the deposition state of the deposition substance of the screw groove pump portion based on the pressure difference between the gas pressures detected by the second and the third pressure detection sections.

The present invention is not limited to the contents of the above-described embodiments. Other aspects conceivable within the scope of the technical idea of the present invention are also included in the scope of the present invention.

What is claimed is:

1. A vacuum pump system comprising:
   a vacuum pump including a suction port, an exhaust port, and a pressure detection section configured to detect a gas pressure in a gas flow path through which gas sucked through the suction port flows to the exhaust port; and
   an arithmetic device configured to perform arithmetic processing for a state of a deposition substance in the gas flow path based on the gas pressure detected by the pressure detection section.

2. The vacuum pump system according to claim 1, wherein
   the pressure detection section includes multiple pressure detection elements provided at different spots to detect gas pressures at multiple spots of the gas flow path and
   the arithmetic device performs, based on the gas pressures detected by the multiple pressure detection elements, the arithmetic processing for the state of the deposition substance in the gas flow path.

3. The vacuum pump system according to claim 2, wherein
   the arithmetic device performs, based on a temporal change in each of the gas pressures detected by the multiple pressure detection elements, the arithmetic processing for the state of the deposition substance in the gas flow path.

4. The vacuum pump system according to claim 2, wherein
   the arithmetic device performs, based on a difference or a fraction between the gas pressures detected by the multiple pressure detection elements, the arithmetic processing for the state of the deposition substance in the gas flow path.

5. The vacuum pump system according to claim 2, wherein
   the arithmetic device performs, based on a temporal change in a difference or a fraction between the gas pressures detected by the multiple pressure detection elements, the arithmetic processing for the state of the deposition substance in the gas flow path.

6. The vacuum pump system according to claim 1, wherein
   the arithmetic device includes a storage device configured to store a relationship between pressure information regarding the detected gas pressure and the deposition state of the deposition substance, and
   the arithmetic device performs the arithmetic processing for the deposition state based on the relationship between the pressure information and the deposition state of the deposition substance in the storage device and the gas pressure detected by the pressure detection section.

7. The vacuum pump system according to claim 6, wherein
   for each recipe as a processing content performed in a process chamber connected to the vacuum pump, the storage device stores the relationship between the pressure information regarding the detected gas pressure and the deposition state of the deposition substance, and
   the arithmetic device performs the arithmetic processing for the deposition state based on the recipe and the pressure information regarding the gas pressure.

8. The vacuum pump system according to claim 1, wherein
   the vacuum pump includes a turbo pump portion and/or a screw groove pump portion,
   the pressure detection section detects a gas pressure of the turbo pump portion and/or a gas pressure of the screw groove pump portion, and
   the arithmetic device performs the arithmetic processing for the state of the deposition substance based on the gas pressure detected in the gas flow path of the turbo pump portion and/or the screw groove pump portion.

9. The vacuum pump system according to claim 1, wherein
   the vacuum pump includes at least the turbo pump portion,
   the pressure detection section includes
   a first pressure detection section configured to detect a gas pressure of an upstream-side flow path of the turbo pump portion and
   a second pressure detection section configured to detect a gas pressure of a downstream-side flow path of the turbo pump portion, and
   the arithmetic device performs the arithmetic processing for the state of the deposition substance based on the gas pressures detected by the first pressure detection section and the second pressure detection section.

10. The vacuum pump system according to claim 1, wherein
    the vacuum pump includes at least the screw groove pump portion,
    the pressure detection section includes
    a first pressure detection section configured to detect a gas pressure of an upstream-side flow path of the screw groove pump portion and
    a second pressure detection section configured to detect a gas pressure of a downstream-side flow path of the screw groove pump portion, and
    the arithmetic device performs the arithmetic processing for the state of the deposition substance based on the gas pressures detected by the first pressure detection section and the second pressure detection section.

11. The vacuum pump system according to claim 1, wherein
    the vacuum pump includes, in this order from an upstream side, the turbo pump portion and the screw groove pump portion, the pressure detection section includes a first pressure detection section configured to detect a gas pressure of an upstream-side flow path of the turbo pump portion and a second pressure detection section configured to detect a gas pressure of a downstream-side flow path of the screw groove pump portion, and the arithmetic device performs the arithmetic processing for the state of the deposition substance based on the gas pressures detected by the first pressure detection section and the second pressure detection section.

12. The vacuum pump system according to claim 1, wherein the vacuum pump includes, in this order from an upstream side, the turbo pump portion and the screw groove pump portion, the pressure detection section includes a first pressure detection section configured to detect a gas pressure of an upstream-side flow path of the turbo pump portion, a second pressure detection section configured to detect a gas pressure in a flow path of downstream-side of the turbo pump portion and upstream-side of the screw groove pump portion, and a third pressure detection section configured to detect a gas pressure of a downstream-side flow path of the screw groove pump portion, and the arithmetic device performs the arithmetic processing for the state of the deposition substance based on the gas pressures detected by the first to third pressure detection sections.

13. The vacuum pump system according to claim 1, wherein the vacuum pump comprises a port where the pressure detection section can be connected from the outside of the vacuum pump.

14. The vacuum pump system according to claim 1, wherein the pressure detection section is provided in a pump housing.

15. The vacuum pump system according to claim 14, wherein the pressure detection section is provided on the upper surface of the stator of a screw groove pump portion or on a surface of a base.

16. The vacuum pump system according to claim 14, wherein the pressure detection section is provided on a surface of a base, which faces to a stator of a screw groove pump portion.

17. The vacuum pump system according to claim 14, wherein the pressure detection section is provided on a suction port.

18. The vacuum pump system according to claim 9, wherein the arithmetic device estimates the state of the deposition substance of the turbo pump portion based on the pressure difference or the pressure fraction between the gas pressures detected by the first and the second pressure detection sections.

19. The vacuum pump system according to claim 10, wherein the arithmetic device estimates the deposition state of the deposition substance of the screw groove pump portion based on the pressure difference or the pressure fraction between the gas pressures detected by the first and the second pressure detection sections.

20. The vacuum pump system according to claim 12, wherein the arithmetic device estimates the state of the deposition substance of the turbo pump portion based on the pressure difference or the pressure fraction between the gas pressures detected by the first and the second pressure detection sections, and estimates the deposition state of the deposition substance of the screw groove pump portion based on the pressure difference between the gas pressures detected by the second and the third pressure detection sections.

\* \* \* \* \*